US007978411B2

(12) United States Patent
Li et al.

(10) Patent No.: US 7,978,411 B2
(45) Date of Patent: Jul. 12, 2011

(54) TETRAFORM MICROLENSES AND METHOD OF FORMING THE SAME

(75) Inventors: Jin Li, Boise, ID (US); Ulrich C. Boettiger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 185 days.

(21) Appl. No.: 11/745,637

(22) Filed: May 8, 2007

(65) Prior Publication Data

US 2008/0278820 A1 Nov. 13, 2008

(51) Int. Cl.
*G02B 27/10* (2006.01)
(52) U.S. Cl. ........................................................ 359/622
(58) Field of Classification Search .................. 359/621, 359/622; 250/216, 578.1
See application file for complete search history.

(56) References Cited

U.S. PATENT DOCUMENTS

| 5,228,051 | A | 7/1993 | Matthews |
| 6,381,072 | B1 * | 4/2002 | Burger ........................ 359/622 |
| 6,624,404 | B2 | 9/2003 | Lee et al. |
| 7,115,853 | B2 | 10/2006 | Jiang et al. |
| 2002/0162943 | A1 | 11/2002 | Lee et al. |
| 2005/0110104 | A1 | 5/2005 | Boettiger et al. |
| 2005/0242271 | A1 | 11/2005 | Weng et al. |
| 2006/0023312 | A1 | 2/2006 | Boettiger |
| 2006/0119951 | A1 | 6/2006 | McGuire, Jr. |
| 2006/0152813 | A1 | 7/2006 | Boettiger et al. |
| 2006/0187554 | A1 | 8/2006 | Boettiger et al. |

FOREIGN PATENT DOCUMENTS

| CN | 1649161 A | 8/2005 |
| DE | 196 14 378 A1 | 11/1996 |
| EP | 1 557 886 A2 | 7/2005 |
| GB | 2 420 224 A | 5/2006 |
| JP | 05-243543 | 9/1993 |
| JP | 06-163866 | 6/1994 |
| JP | 2002-270811 | 9/2002 |
| WO | WO 2005/008781 A1 | 1/2005 |
| WO | WO 2007/002059 A1 | 1/2007 |

OTHER PUBLICATIONS

"CMOS Active Pixel Image Sensors Fabricated Using a 1.8-V, 0.25-μm CMOS Technology," Hon-Sum et al., IEEE Transactions on Electron Devices, vol. 45, No. 4, Apr. 1998, pp. 889-894.
"CMOS Image Sensors Comprised of Floating Diffusion Driving Pixels With Buried Photodiode," Keiji Mabuchi et al., IEEE Journal of Solid-State Circuits, vol. 39, No. 12, Dec. 2004, pp. 2408-2416.
International Search Report and Written Opinion (13 pages).

* cited by examiner

*Primary Examiner* — Joseph Martinez
(74) *Attorney, Agent, or Firm* — Dickstein Shapiro LLP

(57) ABSTRACT

A lens is formed to support and tilt at least one microlens formed on the lens. The degree and direction of slope of the microlens can be controlled based on desired focal characteristics to direct light to or from a pixel of a pixel array.

24 Claims, 15 Drawing Sheets

TETRAFORM MICROLENSES AND METHOD OF FORMING THE SAME

FIELD OF THE INVENTION

Embodiments of the invention relate to the fabrication of microlens structures for image capture or display systems, and more specifically to structures and methods of fabrication of microlens arrays for solid state imager systems.

BACKGROUND OF THE INVENTION

Solid state imagers, including charge coupled devices (CCD) and CMOS image sensors, are commonly used in photo-imaging applications. A solid state imager includes a focal plane array of pixels. Each of the pixels includes a photosensitive device for converting light energy to electrical signals. The photosensitive device can be a photodiode, photovoltaic device, photogate, photoconductor, or other photo-collection element.

Microlenses are commonly placed in a corresponding array over the imager pixels. A microlens is used to focus light onto the photosensitive device (i.e., charge accumulation region) of the pixel. Conventional technology forms microlenses from photoresist material, which is patterned into squares or circles and provided respectively over the pixels. The patterned photoresist material is then heated during manufacturing to shape and cure the microlens.

Use of microlenses significantly improves the photosensitivity and efficiency of the imager by collecting light from a large light collecting area and focusing it on a small photosensitive area of the pixel. The ratio of the overall light collecting area to the photosensitive area of the pixel is known as the "fill factor."

The use of microlens arrays is of increasing importance in imager applications. Imager applications are requiring imager arrays of smaller size and greater resolution. As pixel size decreases and pixel density increases, problems such as optical and electrical crosstalk between pixels become more pronounced. Also, pixels of reduced size have smaller charge accumulation regions. The reduced sizes of the pixels result in less accumulated charge, which is undesirable.

As the size of imager arrays and photosensitive regions of pixels decreases, it becomes increasingly difficult to provide microlenses capable of focusing incident light rays onto the photosensitive regions. This problem is due in part to the increased difficulty in constructing a small enough microlens that has the optimal focal characteristics for the imager and/or that has been optimally adjusted to compensate for optical aberrations introduced as the light passes through the various device layers. Also, it is difficult to correct possible distortions created by multiple regions above the photosensitive region, which results in increased optical crosstalk between adjacent pixels. Optical crosstalk can result when off-axis light strikes a microlens at an obtuse angle. The off-axis light passes through planarization regions, misses the intended photosensitive region and instead strikes an adjacent photosensitive region.

Microlens shaping and fabrication through heating and melting microlens materials also becomes increasingly difficult as microlens structures decrease in size. Previous approaches to control microlens shaping and fabrication do not provide sufficient control to ensure desired optical properties such as e.g., focal characteristics, radius of the microlens, and other parameters needed to provide a desired focal effect for smaller microlens designs. Consequently, imagers with smaller sized microlenses have difficulty in achieving high color fidelity and signal-to-noise ratios.

BRIEF DESCRIPTION OF THE DRAWINGS

FIG. 2 is a partial side view of the microlenses formed above a lens as shown in FIG. 1a.

FIGS. 3a-3i are cross-sectional views of stages in a method of forming the microlenses of FIG. 1a.

DETAILED DESCRIPTION OF THE INVENTION

The various exemplary embodiments described herein provide a variety of structures and methods used to adjust the shape, radius and/or height of a microlens. The embodiments use structures that affect volume and surface force parameters during microlens formation. Example embodiments are directed to a microlens structure that is formed over a larger lens, which supports and tilts the microlens to achieve desired focusing properties.

In the following detailed description, reference is made to the accompanying drawings, which form a part hereof and show by way of illustration specific embodiments in which the claimed invention may be practiced. These embodiments are described in sufficient detail to enable those skilled in the art to practice them, and it is to be understood that other embodiments may be utilized, and that structural, logical, and electrical changes may be made. The progression of processing steps described herein is an example; accordingly, the sequence of steps is not limited to that set forth herein and may be changed as is known in the art, with the exception of steps necessarily occurring in a certain order.

The term "pixel," as used herein, refers to a photo-element unit cell containing a photosensitive device and associated structures for converting photons to an electrical signal. The term "flow," "flowing" or "reflowing" refers to a change in shape of a material which is heated and melts, thereby producing a material flow or shape alteration in the material caused by heating or other similar process. "Flow" is an initial melting and "reflow" is a subsequent melting of material that has been previously flowed.

In addition, while the embodiments are described with reference to a semiconductor-based imager, such as a CMOS imager, it should be appreciated that they may be applied in any micro-electronic or micro-optical device that requires quality microlenses for optimized performance. Additional micro-optical devices that can employ the disclosed microlenses include other solid state imaging devices, e.g., CCD and others, and display devices where a pixel emits light.

In an embodiment, a plurality of microlenses is formed over a larger lens formed over a plurality of pixels. Each microlens has an associated pixel and focuses light on a photosensitive device of the pixel. After forming a first lens layer having a first lens, a second lens layer is formed over the first lens layer. The second lens layer includes at least one microlens. Each microlens can be patterned identically, or can be patterned based on its orientation on the first lens. Alternatively, pairs and other groupings of microlenses can be patterned over the first lens to form unlimited arrangements.

Figure 1A:
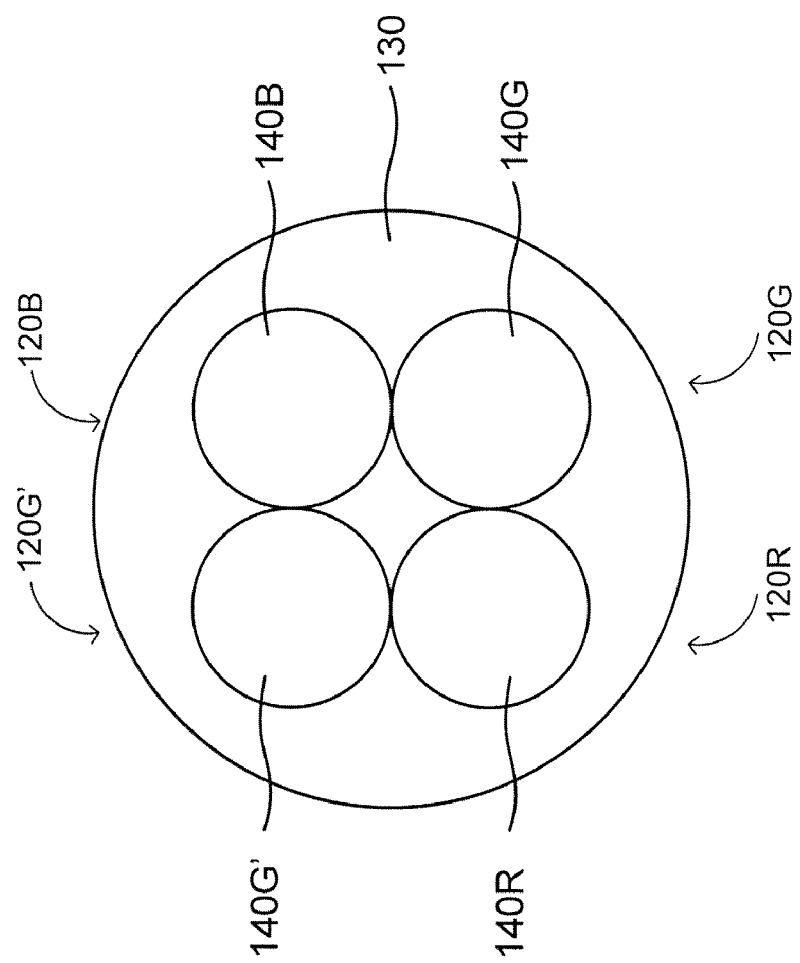
FIG. 1a illustrates a top-down view of a microlens structure having microlenses formed above a lens according to an embodiment described herein.

Referring now the drawings, where like elements are designated by like reference numerals FIG. 1a depicts a top-down view of a microlens structure according to an embodiment disclosed herein. The structure comprises four microlenses 140G, 140R, 140G', 140B arranged in a Bayer pattern above a first lens 130 that covers four pixels 120G, 120R, 120G', 120B. Each microlens 140G, 140R, 140G', 140B focuses incident light onto an associated photosensitive device (not shown) within its respective associated pixel 120G, 120R, 120G', 120B. In this embodiment, the top-down shape of the microlenses 140G, 140R, 140G', 140B and lens 130 are circular.

Figure 1B:
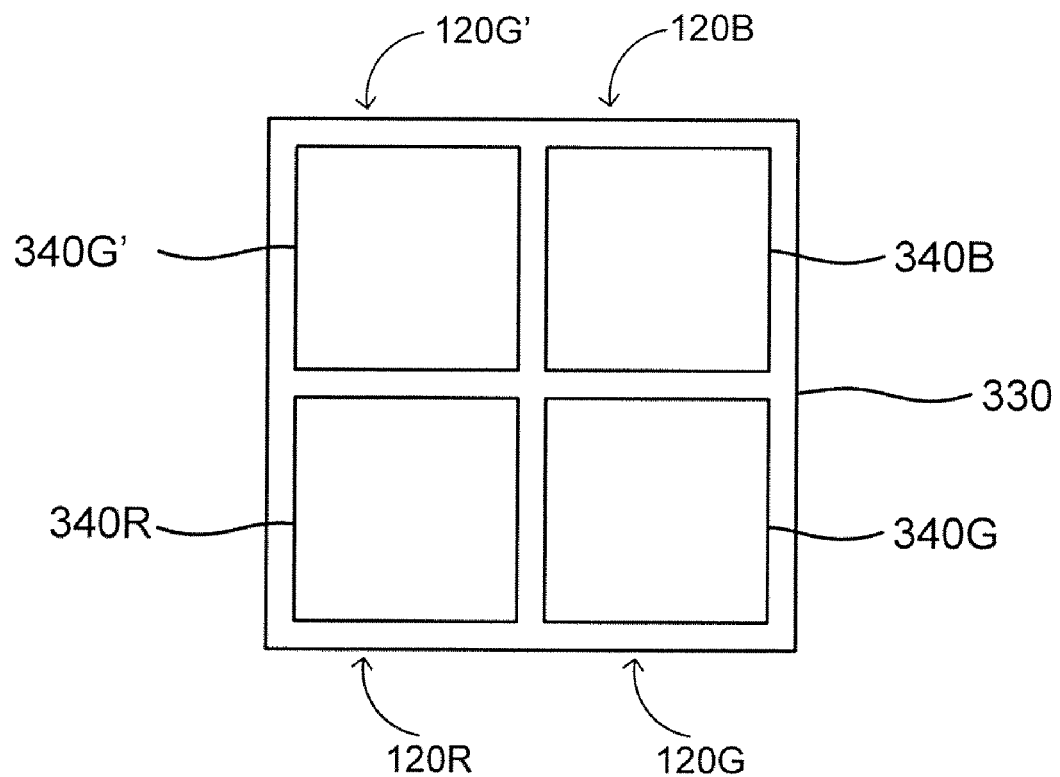
FIG. 1b illustrates a top-down view of another microlens structure having microlenses formed above a lens according to another embodiment described herein.

FIG. 1b depicts a top-down view of another microlens structure according to another embodiment disclosed herein. The structure comprises four microlenses 340G, 340R, 340G', 340B arranged in a Bayer pattern above a first lens 330 that covers four pixels 120G, 120R, 120G', 120B. As with the FIG. 1a embodiment, each microlens 340G, 340R, 340G', 340B focuses incident light onto an associated photosensitive device (not shown) within its respective associated pixel 120G, 120R, 120G', 120B. In this embodiment, the top-down shape of the microlenses 340G, 340R, 340G', 340B and lens 330 are square, forming a pincushion looking structure.

Figure 2:
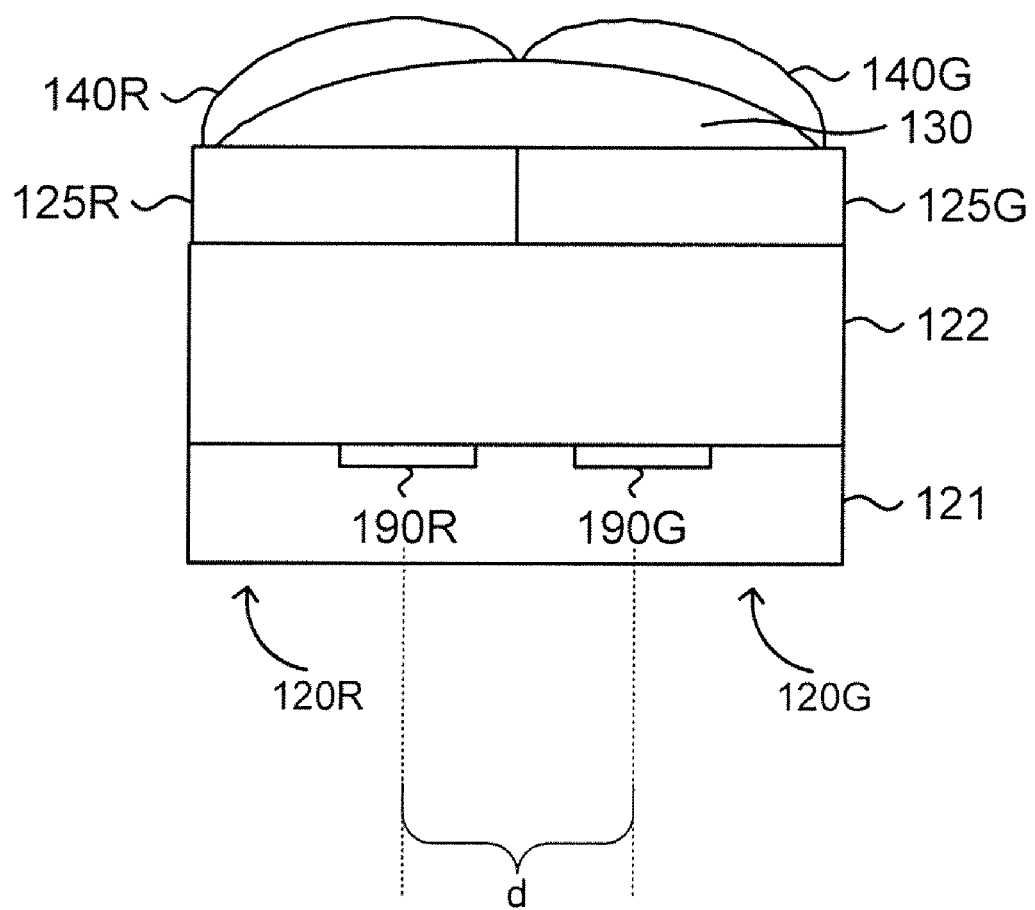

For convenience purposes, the remaining description is made with reference to the microlens structure shown in FIG. 1a. It should be appreciated that the description could also apply to the pincushion structure illustrated in FIG. 1b. FIG. 2 illustrates a side view of two microlenses 140G, 140R formed above a larger first lens 130 that covers two pixels 120G, 120R. Each microlens 140G, 140R focuses incident light onto an associated photosensitive device 190G, 190R of its associated pixel 120G, 120R. Each pixel 120G, 120R is formed in a substrate 121 having the photosensitive devices 190G, 190R, which are covered by one or more transparent optical layers 122. Color filters 125G, 125R, the first lens 130, and microlenses 140G, 140R are provided over the pixels 120G, 120R and layer 122. Each pixel 120R, 120G includes a variety of different parts, as is generally known, most of which are excluded from this discussion for purposes of simplicity. Because FIG. 2 is a cross-sectional view, only two microlenses 140G, 140R and pixels 120G, 120R are shown, but as indicated above with respect to FIG. 1a, two more microlenses (i.e., 140G', 140B) and pixels (i.e., 120G', 120B) are also included. The additional two microlenses 120G', 120B (FIG. 1a) are not described in the following description solely for simplicity purposes and because the cross-sectional views do not illustrate these microlenses.

Lens 130 is formed, as is generally known, above the photosensitive elements 190G, 190R to focus light on the photosensitive devices 190G, 190R. Lens 130 is formed and shaped with generally known optical characteristics to pass light at a preferred direction towards associated photosensitive devices 190G, 190R. In a preferred embodiment, the radius of lens 130 is approximately 6.0 µm. The top surface of lens 130 is upwardly convex shaped, thus having an apex in the center of the lens 130 and slopes downward towards the edges, i.e., to the outer diameter of the lens 130.

As depicted in FIG. 2, microlenses 140G, 140R are formed over the first lens 130. Although not shown in FIG. 2, but shown in FIG. 1a, lens 130 covers a block of four pixels, e.g., pixels 120R, 120G, 120B, 120G', and their associated photosensitive devices 190R, 190G, 190B, 190G', and has four associated microlenses 140R, 140G, 140B, 140G'. Each microlens 140R, 140G is formed and shaped with generally known optical characteristics to pass light at a preferred direction towards an associated photosensitive element 190R, 190G. Microlenses 140R, 140G and lens 130 work together to pass light to the appropriate photosensitive element 190R, 190G. In a preferred embodiment, the radius of each microlens 140R, 140G is approximately 2.4 µm. The top surface of each microlens 140R, 140G is upwardly convex shaped. As each microlens 140R, 140G sits on the surface of lens 130, they are tilted with respect to a top surface of the color filters 125R, 125G, where the tilt angle is dependent on the shape of lens 130. In another aspect, as a lens 130 may not have a consistent slope on its surface, the tilt angle of each microlens 140R, 140G is also dependant on the placement of each microlens 140R, 140G on the lens 130, where placing a microlens higher or lower on the lens 130 can change the tilt angle. Although described with the lens 130 being upwardly convex shaped, the invention is not limited to imagers having upwardly convex shaped lenses.

The microlens structure has been described with use over red, green and blue pixels 120R, 120G, 120G', 120B arranged in the Bayer pattern. This means that the color filters 125R, 125G, etc. are arranged in the Bayer pattern over the pixels such that light of a particular color (i.e., red, blue, green) reaches the correct photosensitive devices 190R, 190G, etc. In a color filter array having a Bayer pattern arrangement, each block of four pixels will have two pixels covered by a green filter, one pixel 120 covered by a red filter, and one pixel covered by a blue filter. As is known in the art, in a Bayer patterned arranged array, the color filters over the block of pixels repeats throughout the array. Although many imagers include color filters over their pixels, there are imagers that do not include separate color filters. As such, the disclosed embodiments are not limited to imagers having separate color filters or any color filters.

As noted above, using lens 130 and microlenses 140R, 140G helps focus light onto the appropriate photosensitive device 190R, 190G, respectively. This combination of lenses and microlenses permits the photosensitive devices 190R, 190G to be placed closer together, thereby decreasing the distance "d" between neighboring photosensitive devices in a block of pixels. Decreasing the distance d decreases the area required for each pixel which can help to increase the fill factor of a pixel array, e.g., when using a shared element pixel architecture for the array.

Figure 3A:
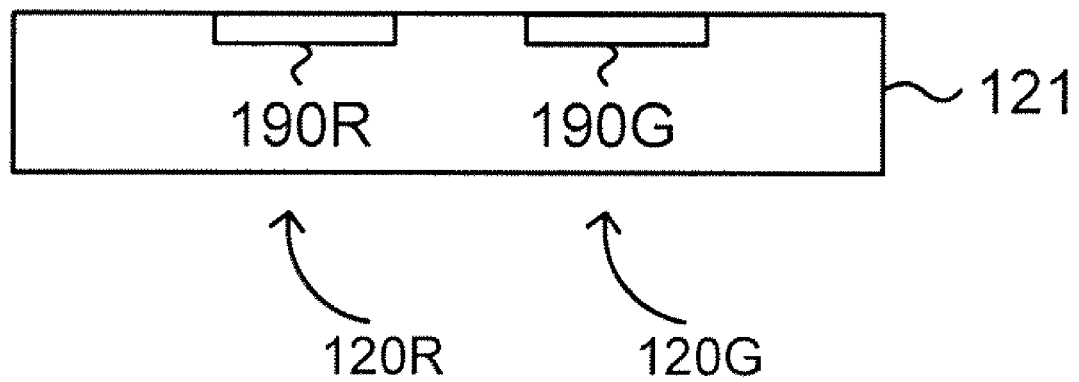
Figure 3B:
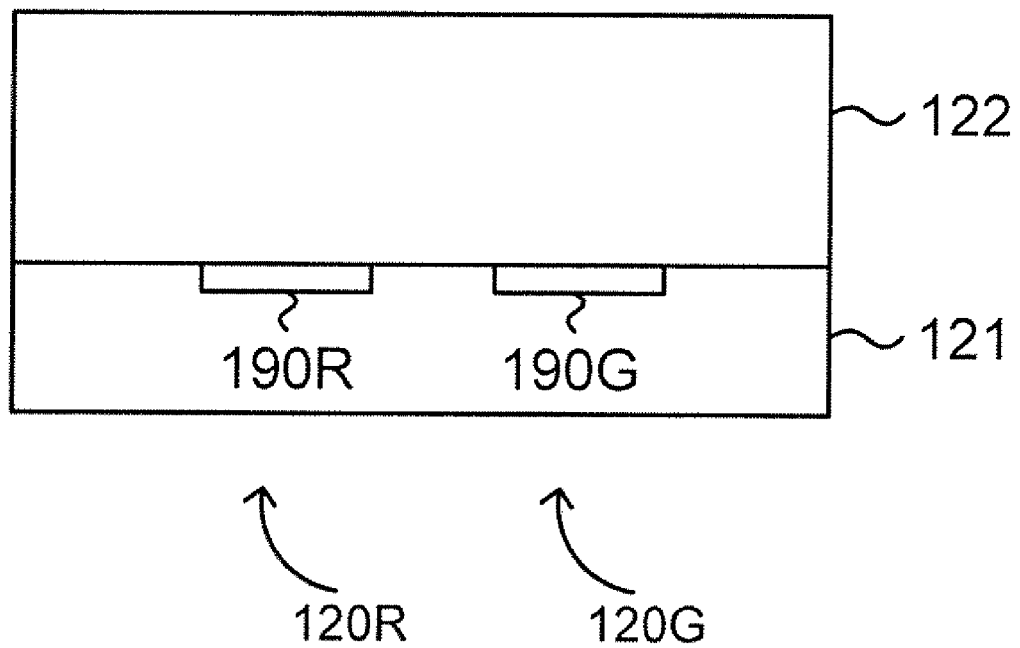

FIGS. 3a-3i depict a method of forming the microlens structure shown in FIGS. 1a and 2. FIG. 3a depicts a substrate 121 formed as conventionally known. The substrate 121 can be formed in a variety of manners. FIG. 3a also depicts photosensitive devices 190R, 190G, formed in the substrate 121. There are many conventional techniques known to form the photosensitive devices 190R, 190G. FIG. 3b depicts the formation of a material layer (or a plurality of layers) 122 over substrate 121. The layer 122 covers circuitry and other elements needed to operate the pixels 120R, 120G.

Figure 3C:
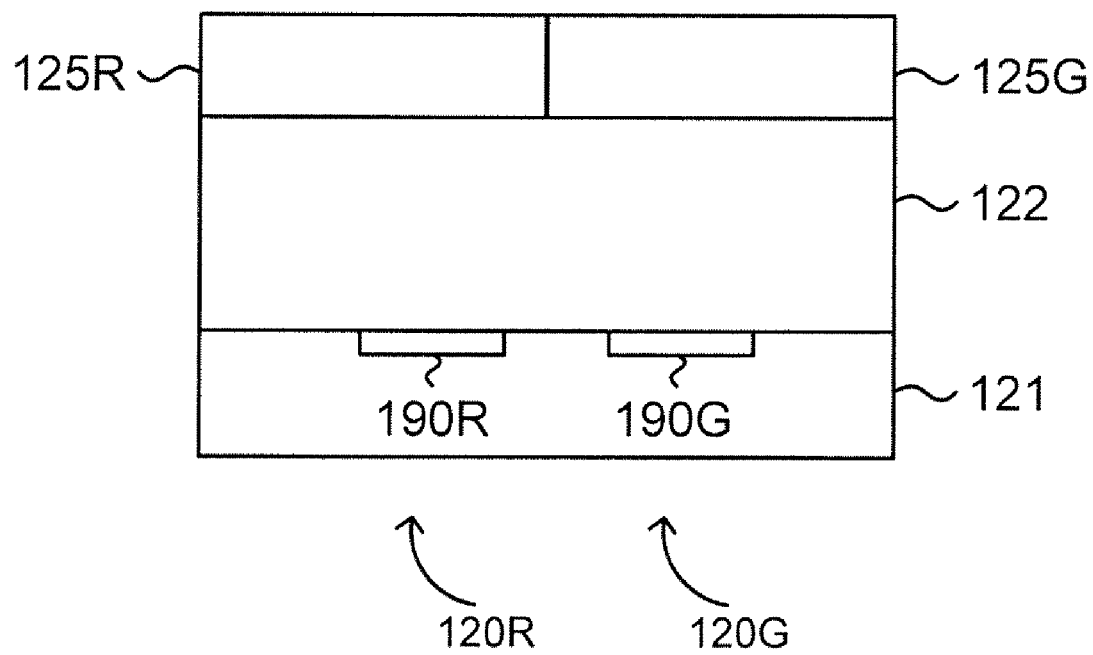

FIG. 3c depicts the formation of a color filter layer having color filters 125R, 125G above layer 122. The filters 125R, 125G comprise photoresist material that permits selected wavelengths, or colors, of light to pass there through. Although only two different color filters are shown, it should be appreciated that four color filters—two green, one red, and one blue—would be used to form a block of pixels in array having a Bayer pattern. As noted above, some embodiments may not include color filters, which means that filters 125R, 125G are not needed.

Figure 3D:
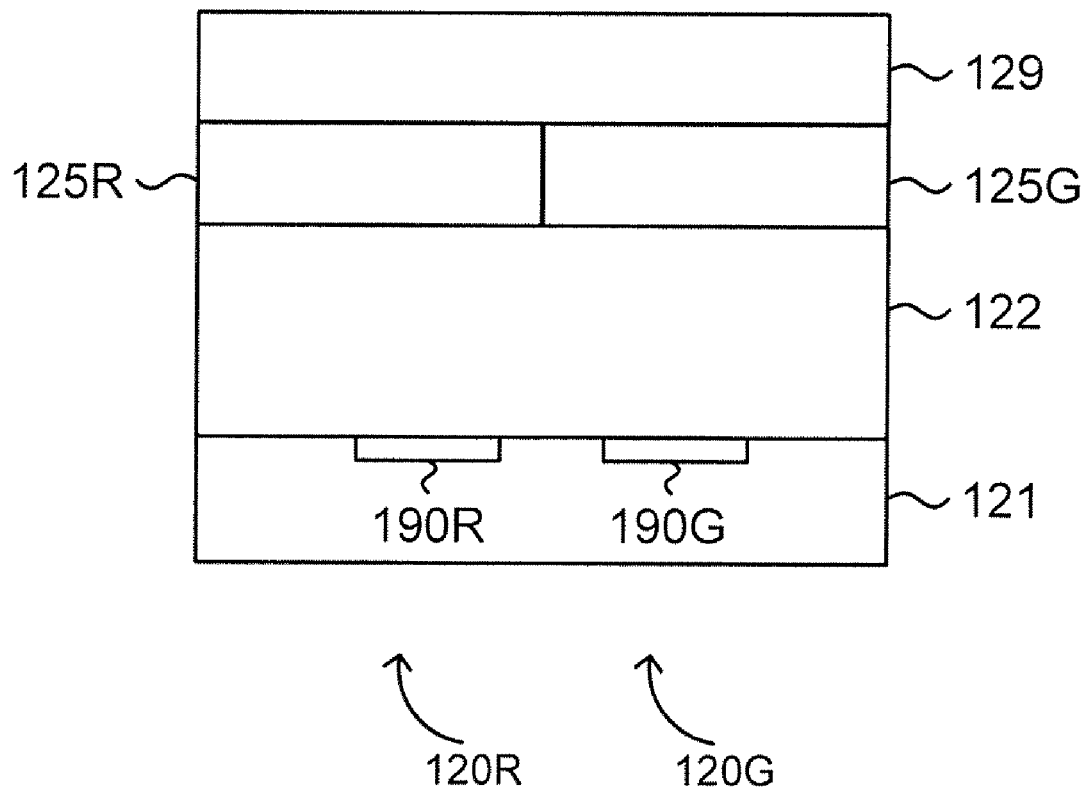

FIG. 3d depicts the initial formation of the first lens layer that will eventually result in the formation of lens 130 (FIG. 2). A resist layer 129 is deposited above the layer of color filters 125R, 125G such that there is enough lens material to form a lens 130 over each block of four pixels.

Figure 3E:
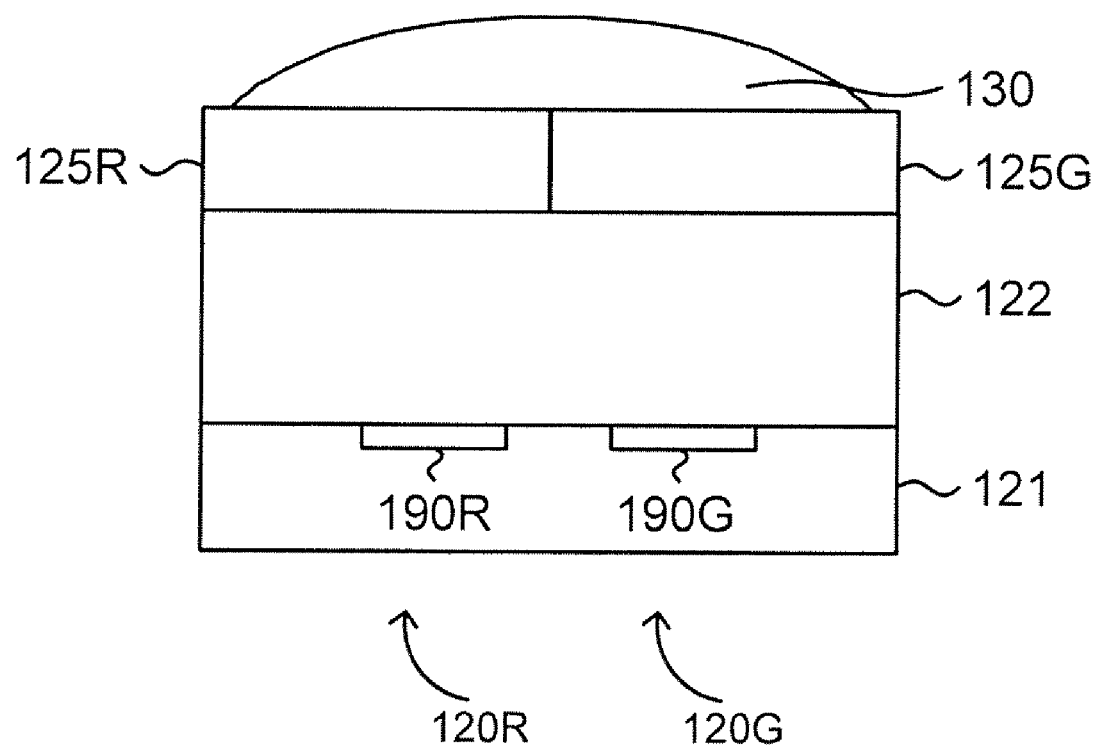

FIG. 3e depicts the formation of the lens 130 from the layer 129. The resist layer 129 is heated to cause the lens material to flow. As a result, lens 130 is formed from layer 129.

Figure 3F:
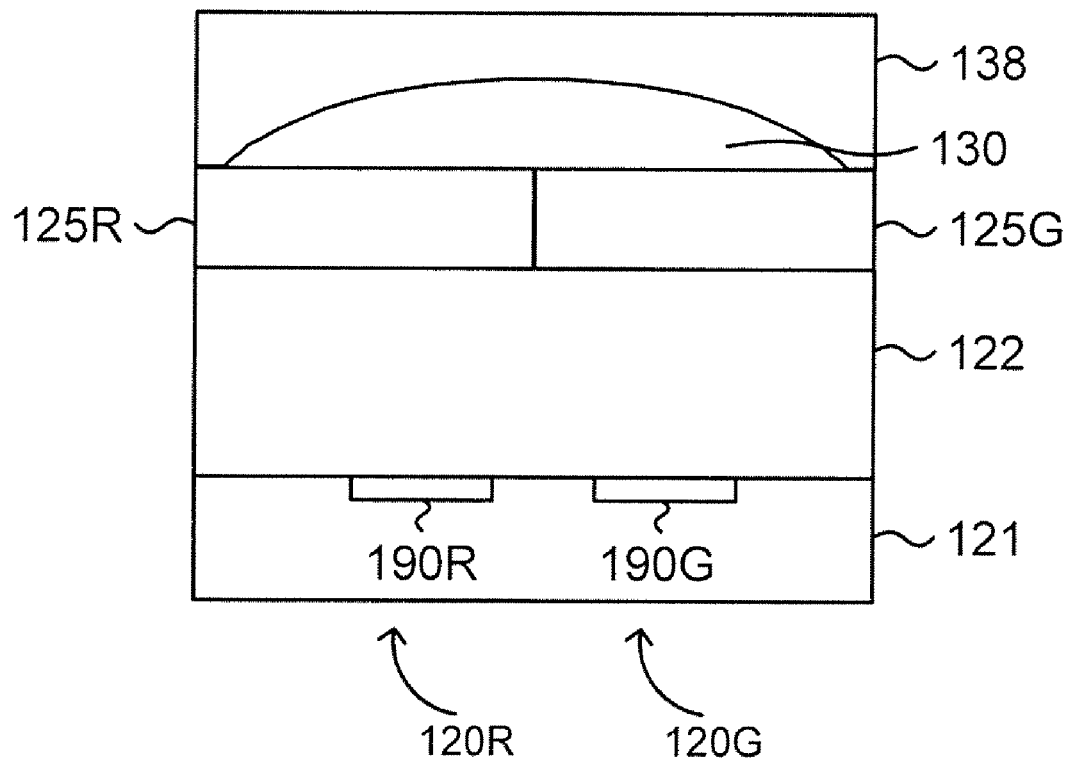

FIG. 3f depicts an initial formation of a second lens layer that will eventually result in a formation of a single microlens or a plurality of microlenses on lens 130. Initially, a photoresist material layer 138 is deposited on the lens 130. The photoresist material layer 138 may the same or a different material used to form lens 130.

Figure 3G:
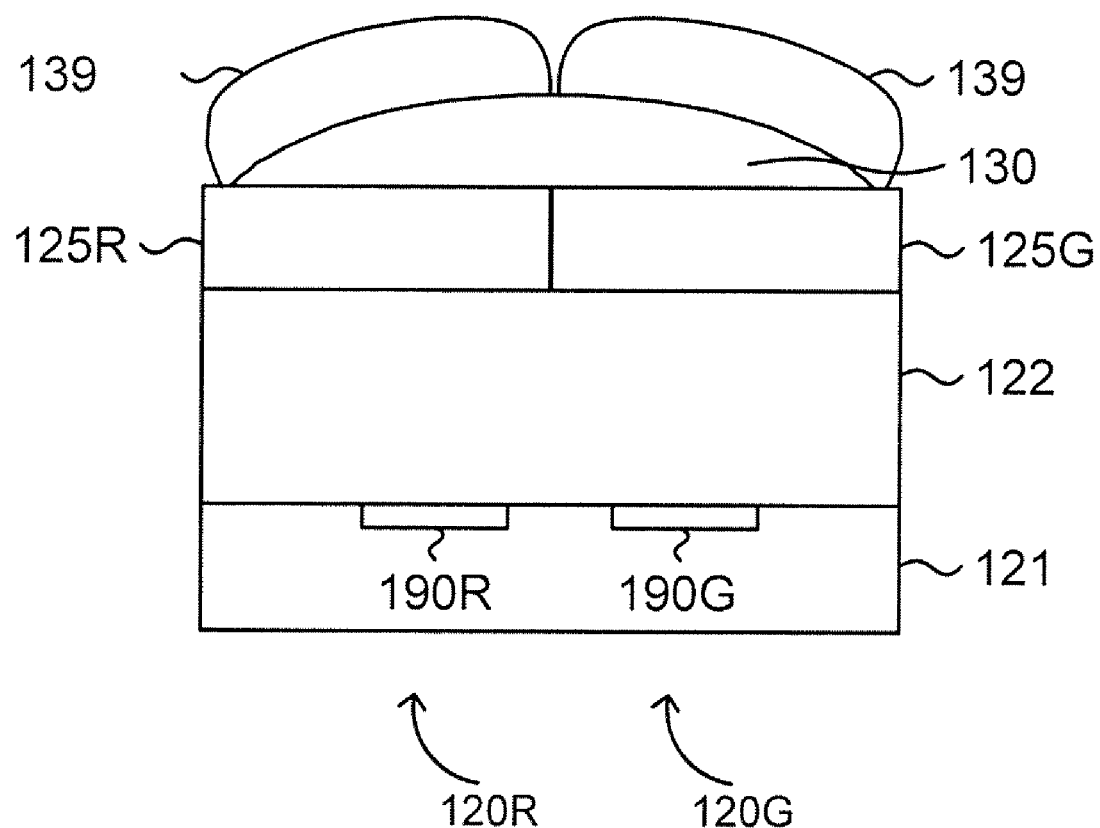

FIG. 3g depicts how the photoresist material layer 138 is coated and patterned, as is conventionally known, into early stage microlenses 139.

Figure 3H:
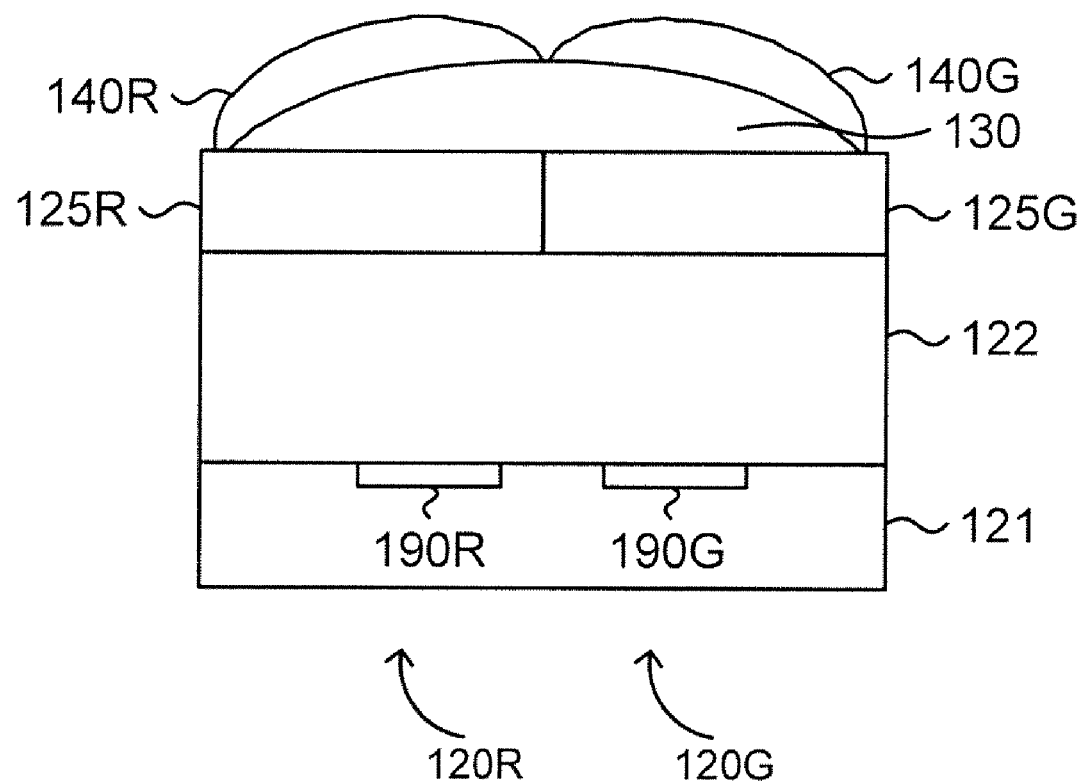

FIG. 3h shows that the early stage microlenses 139 (FIG. 3g) are flowed, as conventionally known, resulting in microlenses 140R, 140G (where microlens 140R corresponds to a microlens for a red pixel and microlens 140G corresponds to a microlens for a green pixel).

Figure 3I:
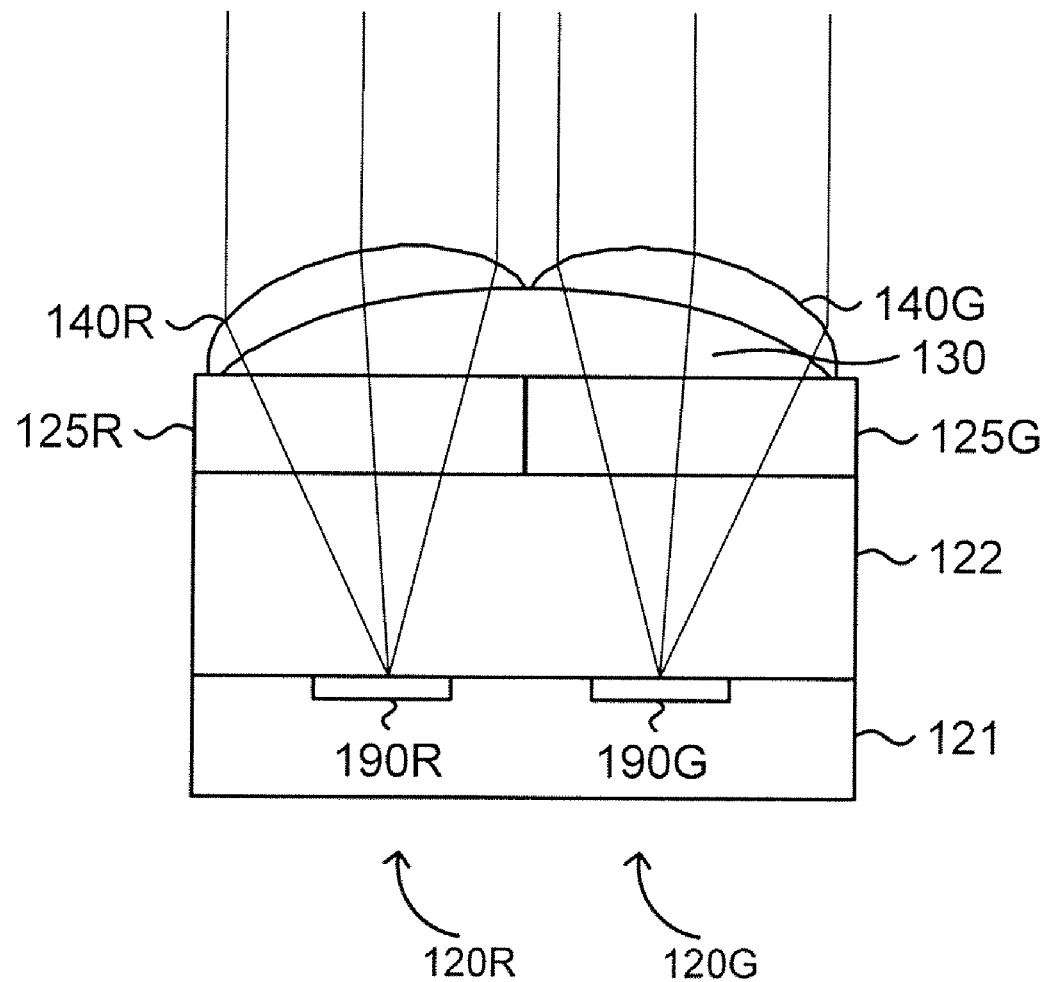

FIG. 3i illustrates with ray tracing the paths of light rays from an image through a fabricated lens system. Ray tracing can be a suitable tool to determine the required adjustments to each microlens 140R, 140G or to other aspects of the pixels 120R, 120G to ensure that light passing through each microlens 140R, 140G and lens 130 is focused on each photosensitive element 190R, 190G. Subsequent processing, such as baking and packaging, takes place according to standard industry practice.

Figure 4:
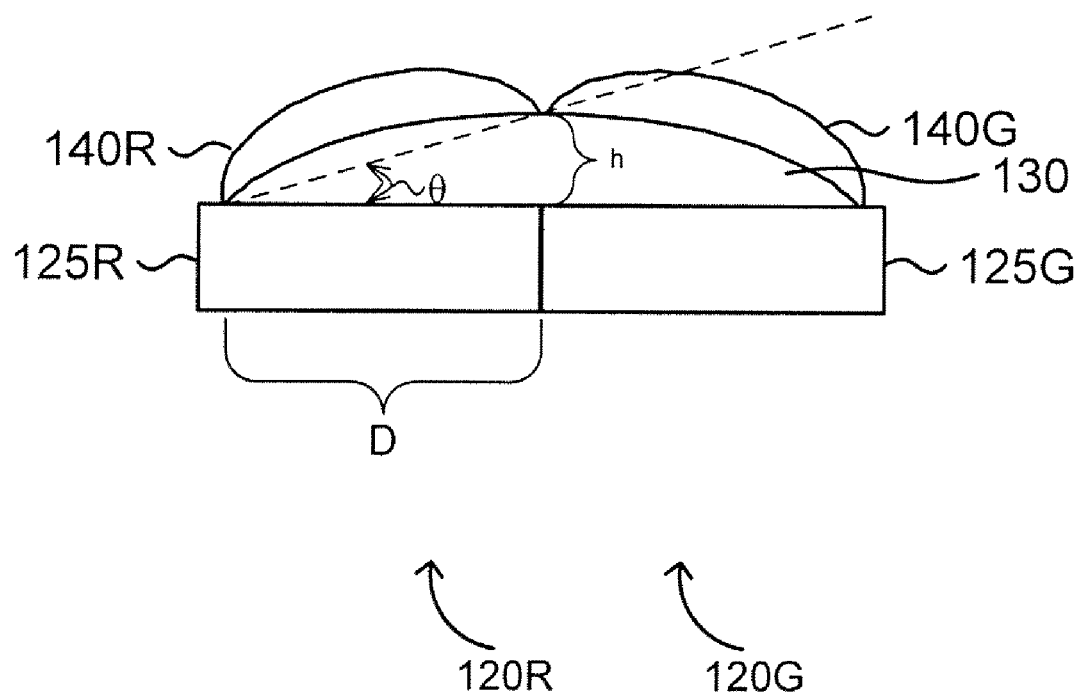
FIG. 4 is another cross-sectional view of the FIG. 1a microlenses.

Referring to FIG. 4, lens 130 provides a support surface for tilted microlenses 140R, 140G, which are formed on and supported by the lens 130. Lens 130 has a sloped upper surface having an angle, "θ," roughly described by the tangent of the height h to the apex of the lens 130 and the horizontal distance D from the edge of lens 130 to the apex of the lens 130. Angle θ can be tailored to be any angle desired, but in an example embodiment is less than about 10 degrees.

Due to the slope of the lens 130, the microlenses 140R, 140G are tilted such that their respective orientation allows their respective focal spots to shift to a target location, to an associated photosensitive device 190R, 190G. This allows placement of each microlens 140R, 140G off-center from its associated photosensitive device 190R, 190G. Each microlens 140R, 140G may be directly over, but not centered over its associated photosensitive device 190R, 190G, or it may be adjacent to its associated photosensitive device 190R, 190G; however, the tilt angle of the lens 130 allows each microlens 140R, 140G to direct incident light through lens 130 to an associated photosensitive device 190R, 190G.

Advantageously, by controlling the degree of tilt of a microlens relative to an associated photosensitive device, more freedom in the design of photosensitive devices is permitted and the focal point of the tilted microlenses can be shifted to the location of the associated photosensitive device.

Furthermore, the physical properties and formation of a lens 130 can be different or the same as the physical properties of a microlens 140R, 140G. The combination of the different optical characteristics and physical properties can be combined in different combinations. For example, the surface properties, refractive properties, and under layers of each of the lens 130 and microlens 140R, 140G can be the same or different. Different materials and methods can used to form the lens 130 and the microlenses 140R, 140G, each having different advantageous properties.

The orientation of the tilted microlenses as well as the dimensions, shape, focal length and other focal characteristics are determined by one or more parameters including: (1) the distance, width or size of the photosensor under the lens where the microlens focuses light; (2) the viscosity and its change over bake time of the microlens material used to form the microlenses during heating; (2) the dimensions and material of the lens; (4) the alterations in flow behavior of the microlens material resulting from microlens structures affecting microlens material flow behavior during heating; (5) the effects of pre-heating or pre-flow treatment of lens or microlens materials; (6) the designed orientation of the microlens structure prior to reflow; and (7) the effects of the lens material that may alter flow properties of the microlens material.

Figure 5:
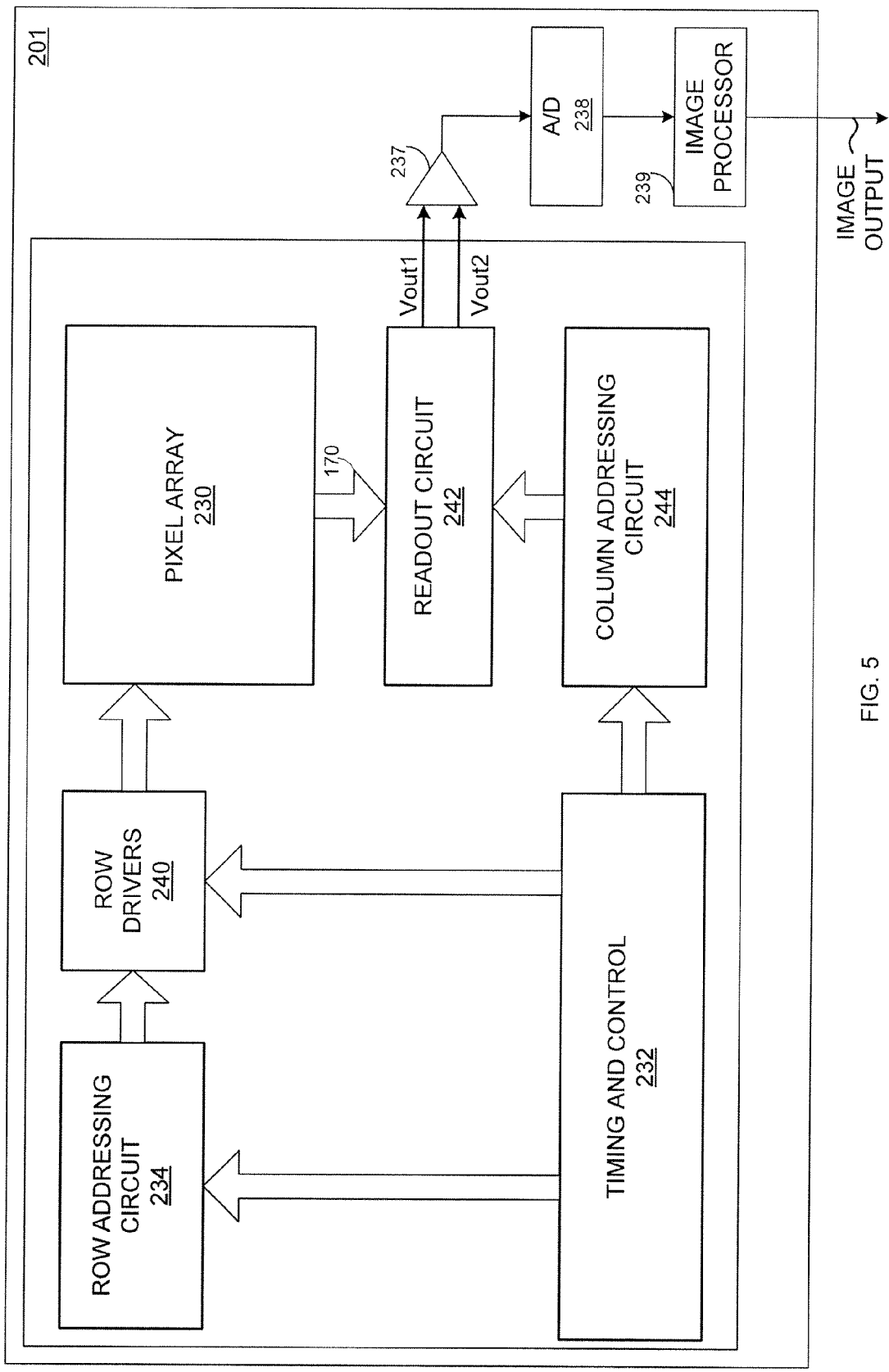
FIG. 5 is a schematic of an imager using pixels having microlenses constructed in accordance with the embodiments described herein.

FIG. 5 illustrates a CMOS imager integrated circuit chip 201 that includes an array 230 of pixels, and a controller 232, which provides timing and control signals to enable image capture and reading out of signals stored in the pixels in a manner commonly known to those skilled in the art. The array 230 of pixels are covered with lenses and microlenses constructed as described above. Typical arrays have dimensions of M×N pixels, with the size of the array 230 depending on a particular application. The timing and control circuit 232 controls array 230 for image capture and readout. The array 230 is read out a row at a time using a column parallel readout architecture. The controller 232 selects a particular row of pixels in the array 230 by controlling the operation of row addressing circuit 234 and row drivers 240. Charge signals stored in the selected row of pixels are provided on column lines 170 to a readout circuit 242. The pixel signals read from each of the columns can be read out sequentially using a column addressing circuit 244. Pixel signals (Vrst, Vsig) corresponding to the read out reset signal and integrated charge signal are provided as respective outputs Vout1, Vout2 of the readout circuit 242. These signals for each pixel are subtracted in differential amplifier 237 providing a signal representing the amount of light detected by a pixel. The signal from differential amplifier 237 is provided to an analog to digital converter 238 and the image represented by all digital pixel values are processed in an image processor 239, which provides an output image.

Figure 6:
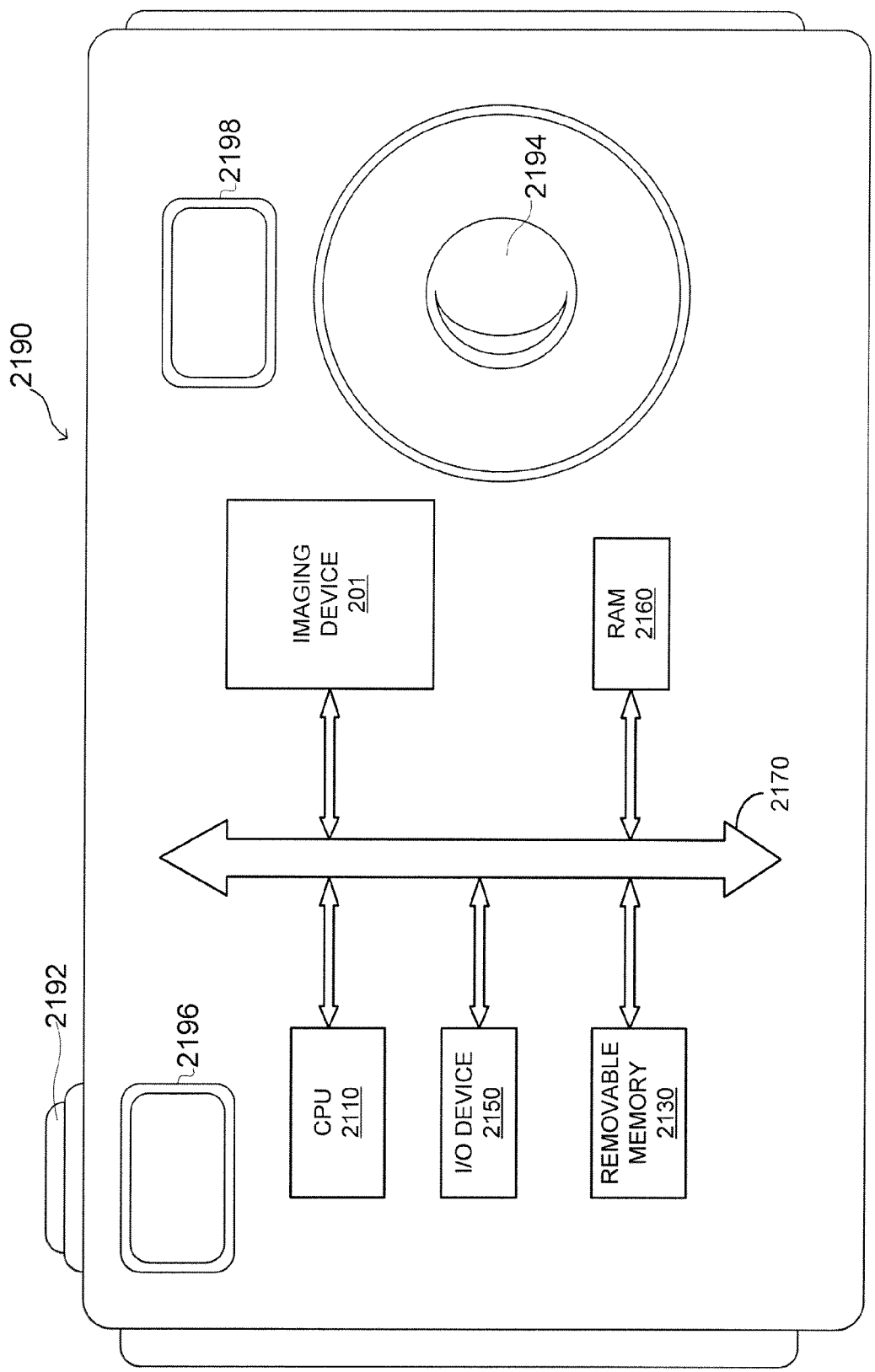
FIG. 6 illustrates a processing system including the imaging device of FIG. 5.

FIG. 6 is a block diagram of an image processing system, e.g., a camera system, 2190 incorporating an imaging device 201 in accordance with the method and apparatus embodiments described herein. The imaging device 201, shown in FIG. 5, provides an image output signal as described above. A camera system 2190 generally comprises a shutter release button 2192, a view finder 2196, a flash 2198 and a lens system 2194. A camera system 2190 generally also comprises a camera control central processing unit (CPU) 2110, for example, a microprocessor, that communicates with one or more input/output (I/O) devices 2150 over a bus 2170. The CPU 2110 also exchanges data with random access memory (RAM) 2160 over bus 2170, typically through a memory controller. The camera system may also include peripheral devices such as a removable flash memory 2130, which also communicates with CPU 2110 over the bus 2170.

Various modifications in the structure disclosed and method of forming the same will be apparent to those of skill in the art as a result of this disclosure. Substitutions, additions, deletions, modifications and/or other changes may be made to the described embodiments without departing from the spirit or scope of the invention. For example, although the embodiments are described in reference to four microlenses being above a lens, the invention is not so limited. Accord-

What is claimed as new and desired to be protected by Letters Patent of the United States is:

1. A microlens structure comprising:
    a lens formed over a first plurality of photosensitive imaging devices which are a subset of a second plurality of photosensitive imaging devices which form part of an imaging pixel array, said lens being supported by an upper surface of a material which is provided over said pixel array, an upper surface of the lens having a slope with respect to the upper surface of said material; and
    a microlens associated with a respective photosensitive imaging device supported by the lens; said microlens and lens cooperating to direct image light onto said respective photosensitive imaging device.

2. A microlens structure according to claim 1, wherein a plurality of microlenses are supported by the lens.

3. A microlens structure according to claim 2, wherein each of said plurality of microlenses is tilted.

4. A microlens structure according to claim 1, wherein the lens comprises a photoresist material.

5. A microlens structure according to claim 1, wherein said microlens is supported directly on the lens.

6. A microlens structure according to claim 1, wherein a plurality of microlenses are supported by the lens, each microlens being associated with a respective photosensitive imaging device.

7. A microlens structure according to claim 6, wherein each microlens is associated with a color from a Bayer pattern.

8. A microlens structure according to claim 6, wherein each microlens is associated with at least one color filter.

9. A microlens structure according to claim 6, wherein no more than four microlenses are supported by the lens.

10. A microlens structure according to claim 8, wherein said material forms said at least one color filter.

11. A lens array comprising:
    a plurality of lenses formed over a pixel array, wherein each lens is formed over a respective plurality of photosensitive imaging devices of the pixel array; and
    an array plurality of microlenses located on and associated with each lens, wherein each microlens focuses light onto a respective photosensitive imaging device of the respective plurality of photosensitive imaging devices.

12. A lens array according to claim 11, wherein each lens is formed over a plurality of color filters and a microlens-supporting surface of each lens is inclined with respect to an upper surface of the plurality of color filters by less than about 10 degrees.

13. A lens array according to claim 11, wherein each lens comprises a photoresist material.

14. A lens array according to claim 11, wherein each microlens comprises a photoresist material.

15. A lens array according to claim 11, wherein at least two microlenses of the array of microlenses are positioned over a common photosensitive imaging device for directing incident light to the common photosensitive imaging device.

16. A lens array according to claim 11, wherein each of said microlenses of the array are positioned over a respective photosensitive imaging device for directing incident light to the respective photosensitive imaging device.

17. An imager structure comprising:
    a plurality of pixels formed in a substrate, wherein each pixel comprises a photosensitive imaging device;
    a plurality of lenses formed over the plurality of pixels, wherein each lens is formed over at least two pixels of the plurality of pixels and is supported by a material layer; and
    a plurality of groups of microlenses, each group of microlenses being associated with and being respectively supported by an associated lens, each microlens in said group being positioned to pass incident light to at least one of the plurality of pixels through said associated lens, wherein the plurality of lenses and the plurality of groups of microlenses focus light through said material layer and onto photosensitive imaging devices of the pixels.

18. An imager structure as in claim 17, wherein each lens has similar shape and is sloped in substantially the same manner.

19. An imager structure as in claim 17, wherein at least one of said lenses is upwardly convex in shape and slopes downward and away from a center of the lens, where the slope is substantially symmetric in each direction.

20. An imager structure as in claim 17, wherein each lens and microlens has a circular shape.

21. An imager structure as in claim 17, wherein each lens and microlens has a square shape.

22. An image processing system comprising:
    a processor; and
    an imager structure coupled to the processor, said imager structure comprising:
    a pixel array, comprising a plurality of photosensitive imaging devices;
    a plurality of lenses formed over the pixel array, each lens being supported by a color filter material layer and associated with a of the pixel array, wherein each lens possesses a lower surface wholly supported by the color filter material layer; and
    a plurality of groups of microlenses, each group of microlenses being associated with and being respectively supported by an associated lens, each microlens in said group being positioned to pass incident light to at least one of the plurality of pixels associated with said lens, wherein the plurality of lenses and the plurality of groups of microlenses focus light on photosensitive imaging devices of the pixel array.

23. An image processing system of claim 22, wherein each lens has similar shape and is sloped in substantially the same manner.

24. An imager processing system as in claim 22, wherein at least one of said lenses is upwardly convex in shape and slopes downward and away from a center of the lens, where the slope is substantially symmetric in each direction.

* * * * *

UNITED STATES PATENT AND TRADEMARK OFFICE
CERTIFICATE OF CORRECTION

PATENT NO. : 7,978,411 B2  Page 1 of 1
APPLICATION NO. : 11/745637
DATED : July 12, 2011
INVENTOR(S) : Jin Li et al.

It is certified that error appears in the above-identified patent and that said Letters Patent is hereby corrected as shown below:

In column 7, line 43, in Claim 11, after "an array" delete "plurality".

In column 8, line 40, in Claim 22, after "with a" insert -- plurality of pixels --.

Signed and Sealed this
Sixth Day of September, 2011

David J. Kappos
*Director of the United States Patent and Trademark Office*